United States Patent
Esplin et al.

(10) Patent No.: US 9,891,258 B2
(45) Date of Patent: Feb. 13, 2018

(54) METHODS AND APPARATUS FOR THERMAL TESTING OF ANTENNAS

(71) Applicant: RAYTHEON COMPANY, Waltham, MA (US)

(72) Inventors: Roger C. Esplin, Marana, AZ (US); Heath A. Strickland, Sahuarita, AZ (US)

(73) Assignee: Raytheon Company, Waltham, MA (US)

( * ) Notice: Subject to any disclaimer, the term of this patent is extended or adjusted under 35 U.S.C. 154(b) by 151 days.

(21) Appl. No.: 14/801,159

(22) Filed: Jul. 16, 2015

(65) Prior Publication Data
US 2017/0016944 A1    Jan. 19, 2017

(51) Int. Cl.
*G01R 29/10* (2006.01)
*G01R 31/00* (2006.01)

(52) U.S. Cl.
CPC .......... *G01R 29/105* (2013.01); *G01R 31/003* (2013.01)

(58) Field of Classification Search
CPC ........ H01Q 13/08; H01Q 13/10; H01Q 1/242; H01Q 21/30; H01Q 9/16; G01R 29/105
USPC .......................................... 343/703, 705, 713
See application file for complete search history.

(56) References Cited

U.S. PATENT DOCUMENTS

| | | | | | |
|---|---|---|---|---|---|
| 3,806,943 | A | * | 4/1974 | Holloway | G01R 29/105 342/4 |
| 4,860,602 | A | * | 8/1989 | Hines | G01R 29/105 165/298 |
| 6,031,486 | A | * | 2/2000 | Anderson | B64G 7/00 342/165 |
| 6,975,282 | B2 | * | 12/2005 | Kaufman | H01Q 1/1207 343/912 |
| 2007/0004338 | A1 | * | 1/2007 | Qi | H04B 1/1027 455/63.1 |
| 2008/0266012 | A1 | * | 10/2008 | Yahata | H03H 7/40 331/177 R |
| 2010/0006539 | A1 | * | 1/2010 | Yang | C23C 16/0245 216/37 |

* cited by examiner

*Primary Examiner* — Tho G Phan
(74) *Attorney, Agent, or Firm* — Daly, Crowley, Mofford & Durkee, LLP (57) ABSTRACT

Methods and apparatus for thermal testing of an antenna. Embodiments enable positioning a unit under test having an antenna in an anechoic chamber and, manipulating a RF transparent heat chamber over the antenna. A system can raise a temperature in the heat chamber to a selected temperature and obtain antenna performance information while the antenna is heated in the heat chamber. Temperature affects on antenna performance can be determined.

19 Claims, 12 Drawing Sheets

METHODS AND APPARATUS FOR THERMAL TESTING OF ANTENNAS

BACKGROUND

As is known in the art, temperature can affect the performance of antennas. Conventional techniques do not provide a way to collect antenna patterns while heating the antenna without affecting the patterns. Known techniques to evaluate antenna performance over temperature include heating up antennas with quartz lamps, moving the lamps away from the antenna unit under test, and measuring VSWR (voltage standing wave ratio) data. In another known technique, thermal electric pads are attached to the underside of the antenna to heat the antenna. However, this method may be limited in temperature to about 232° C. In addition, it may be difficult to obtain accurate results for non-uniform surfaces. If the antenna survives the temperature exposure and performs within the specification, the antenna is determined to be functional.

SUMMARY

Embodiments of the invention enable thermal testing of RF antennas while taking antenna patterns in a test environment. Interference of the RF energy received or transmitted by the antenna unit under test is minimized with the use of RF transparent test equipment while live antenna patterns are obtained as antenna temperature changes. By obtaining antenna measurements during thermal testing, the behavior characteristics of the antenna and antenna materials, such as dielectrics, can be determined over temperature.

It is understood that a wide range of applications can expose an antenna to relatively high temperatures. For example, conformal antennas on aircraft and other vehicles can be exposed to temperatures of several hundred degrees Celsius. Vehicles may have antennas exposed to direct sunlight or enclosed in confined areas subject to thermal buildup. The temperature of the antenna may impact performance. A GPS antenna on a car, for example, may be subject to significant temperature changes in diverse environments ranging from a desert in the summer to winter at high latitudes. High temperatures can affect how an antenna performs due to the thermal changes in the dielectric materials and other antenna components.

In embodiments, an antenna is actively heated while RF antenna patterns are measured in an anechoic chamber that minimizes RF interference to the antenna patterns. In one embodiment, an antenna of a unit under test is first exercised and performance parameters measured with no applied heat and no heat chamber present. The thermal equipment including the RF transparent heat chamber is coupled to the antenna after which the antenna is again exercised and performance parameters measured without applied heat. This enables an understanding of the affects the presence of the equipment has on the antenna. The antenna is then subject to thermal testing by activating the test equipment during which the antenna is exercised and performance parameters measured at various temperatures. For example, antenna patterns can be taken at selected temperatures in accordance with a test protocol. After the thermal testing, the antenna can again be exercised and performance parameters measured to determine if the antenna has been permanently affected by thermal testing.

In illustrative embodiments, the heat chamber comprises a high temperature, low dielectric, generally spherical chamber that covers the antenna being tested. Low dielectric tubing is coupled to the heat chamber from a heat source, which can be programmed to run specific temperature profiles. Once the antenna has reached the desired temperature the RF collection system is activated. Heat is delivered to the antenna via the heat chamber while antenna data is collected.

In one aspect of the invention, a method comprises: positioning a unit under test having an antenna in an anechoic chamber; manipulating a RF transparent heat chamber over the antenna; raising a temperature in the heat chamber to a selected temperature; and obtaining antenna performance information while the antenna is heated in the heat chamber.

The method can further include one or more of the following features: manipulating the heat chamber to a number of temperatures and obtaining antenna performance information each of the number of temperatures, obtaining antenna performance information before installation of the heat chamber over the antenna, obtaining antenna performance information after installation of the heat chamber over the antenna and before heating of the heat chamber, obtaining antenna performance information after removal of the heat chamber over the antenna, obtaining antenna performance information after the antenna reaches ambient temperature, manipulating the position of the unit under test in azimuth, elevation and/or roll, using RF transparent tubing to carry heated air to the heat chamber, the heat chamber is substantially spherical with at least one aperture into which a portion of the unit under test is placed, at least a portion of the heat chamber has a hemispherical shape, the heat chamber comprises a Ceramic Matrix Composite (CMC) with a quartz fiber and a polysiloxane resin (prepreg composite), heating the heat chamber to a temperature of greater than 500 degrees Celsius, the unit under test comprises at least a portion of a missile, the unit under test comprises at least a portion of an aircraft, the unit under test comprises at least a portion of a vehicle having a GPS system, and/or the unit under test comprises at least a portion of a cell tower.

In another aspect of the invention, a vehicle comprises an antenna tested in accordance with the method above, and/or any of the above features.

In a further aspect of the invention, a system comprises: a positioning system to position a unit under test having an antenna in an anechoic chamber; a RF transparent heat chamber disposed over the antenna; a control system to raise a temperature in the heat chamber to a selected temperature; and a measurement system to obtain antenna performance information while the antenna is heated in the heat chamber.

The system can further include one or more of the following features: manipulating the heat chamber to a number of temperatures and obtaining antenna performance information each of the number of temperatures, obtaining antenna performance information before installation of the heat chamber over the antenna, obtaining antenna performance information after installation of the heat chamber over the antenna and before heating of the heat chamber, obtaining antenna performance information after removal of the heat chamber over the antenna, obtaining antenna performance information after the antenna reaches ambient temperature, manipulating the position of the unit under test in azimuth, elevation and/or roll, using RF transparent tubing to carry heated air to the heat chamber, the heat chamber is substantially spherical with at least one aperture into which a portion of the unit under test is placed, at least a portion of the heat chamber has a hemispherical shape, the heat chamber comprises a Ceramic Matrix Composite (CMC) with a quartz fiber and polysiloxane resin (prepreg composite), heating the heat chamber to a temperature of greater than 500 degrees Celsius, the unit under test comprises at least a portion of a missile, the unit under test comprises at least a portion of an aircraft, the unit under test comprises at least a portion of a vehicle having a GPS system, and/or the unit under test comprises at least a portion of a cell tower.

BRIEF DESCRIPTION OF THE DRAWINGS

The foregoing features of this invention, as well as the invention itself, may be more fully understood from the following description of the drawings in which.

DETAILED DESCRIPTION

Figure 1A:
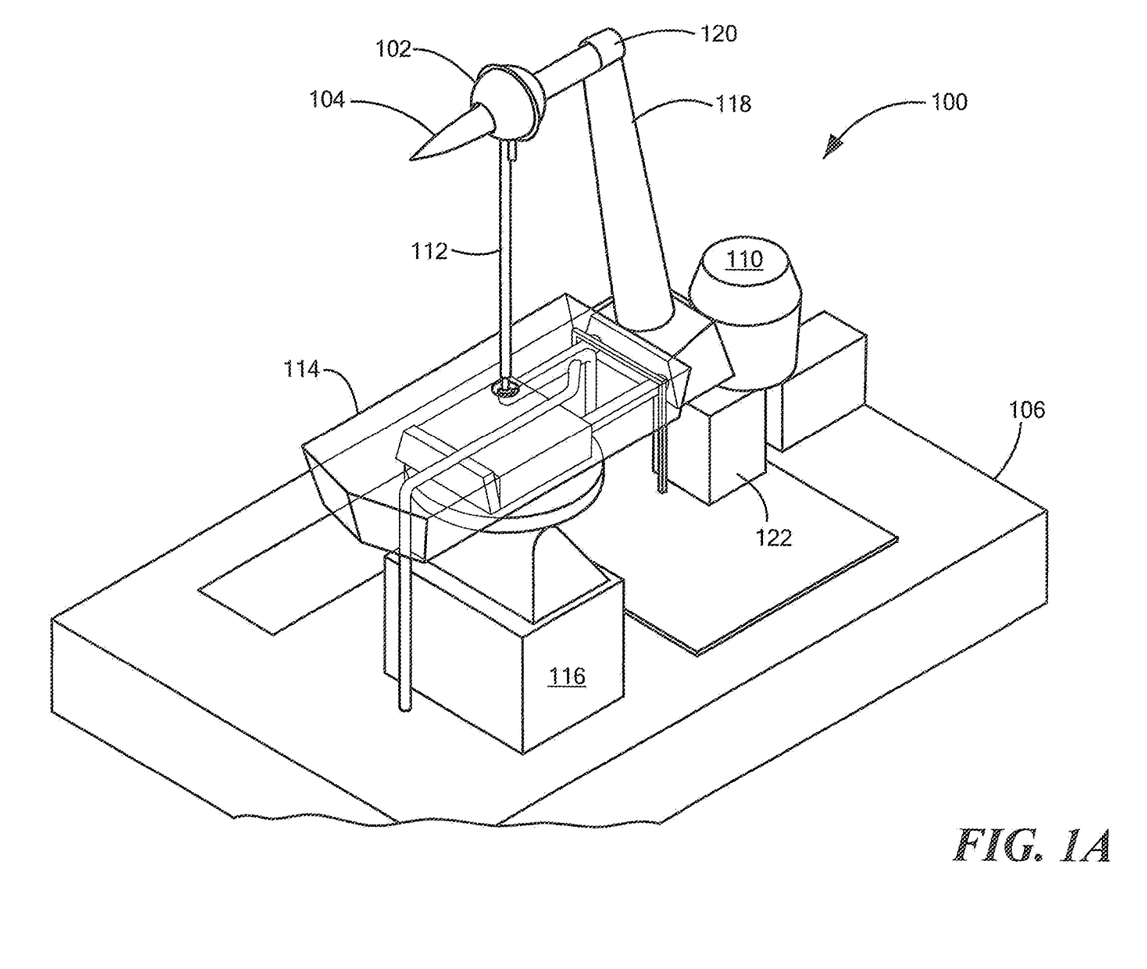
FIGS. 1A and 1B show a schematic representation of system for thermal testing of an antenna within a RF transparent heat chamber.
Figure 1B:
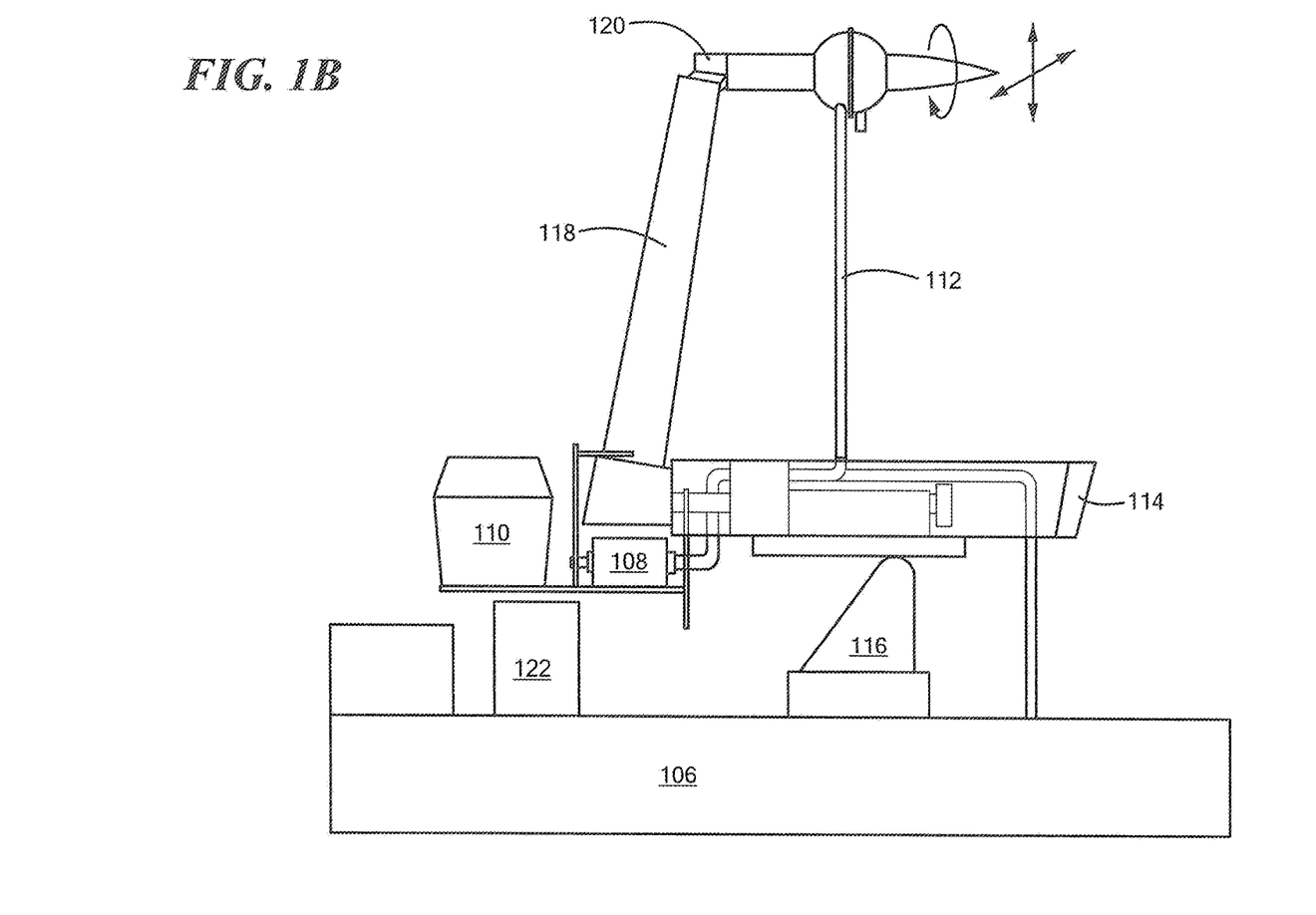

FIGS. 1A and 1B show a system 100 for thermal testing of an antenna in accordance with illustrative embodiments of the invention. In general, a RF transparent heat chamber 102 covers an antenna (not shown in FIGS. 1A,B) disposed on the surface of a unit under test 104. The antenna can be provided as an antenna on the surface or subsurface of a unit, such as an aircraft, pod, missile, vehicle, ship, car, building, etc. The interior of the heat chamber 102 can be heated to a desired temperature to raise the temperature of the antenna inside the heat chamber. Since the heat chamber 102 is substantially transparent to RF energy, the antenna can be exercised to obtain antenna pattern and other information during thermal testing to evaluate antenna performance over temperature changes.

The system 100 can include a platform 106 to support the test equipment. A heat source 108 can be provided to heat air to a desired temperature. In embodiments, a 15 kW electric heater is used to heat air that is forced by a blower 110 into the heat chamber 102 via RF transparent tubing 112, such as polyimide tubing. An equipment station 114, which can contain tubing and other equipment, is supported by a positioning system 116 that can tilt, pivot, and/or rotate. A tower 118 extends from the equipment station 114 and supports the unit under test 104 and RF chamber 102. In embodiments, a movement mechanism 120 can manipulate the unit under test 104 in roll, azimuth, and elevation in conjunction with the positioning mechanism 116.

The system 100 can include a control system 122 to interface with a user for controlling temperature and transformer 124 to increase the power to the heat source in the heat chamber 102, manipulating the position of the UUT, measuring antenna signals, and controlling a RF source remote from the unit under test 104.

The temperature affects on the antenna and can be determined from thermal testing. Antenna components, such as dielectric materials, have characteristics that change over temperature. Antennas comprise materials that vary in dielectric constant to meet antenna design and performance requirements. Illustrative materials include, for example, ceramic materials, TEFLON based materials, and the like, that have characteristics that change with temperature. For example, temperature increases can cause materials to change in size in X, Y, Z directions which in turn change dielectric properties, which can change the tuning of the antenna. Metal materials used to contain the antenna (e.g., antenna ground plane) will change as well, which can affect the ground plane. It will be readily appreciated that changes in ground plane characteristics can affect the performance of the antenna, as well as the antenna RF materials. For example, an antenna is designed to perform at a frequency range. When heat is applied, the frequency characteristics of the antenna materials can change. Embodiments of the invention can determine how the antennas dielectric properties change over temperature to ensure the antenna will perform in the frequency range and expected environment for which it was designed. In some cases, selected RF materials may not have sufficient mechanical and electrical properties to determine the ideal material for the expected operating environment. Embodiments of the invention can ensure the performance of the materials selected at elevated temperatures.

Figure 2:
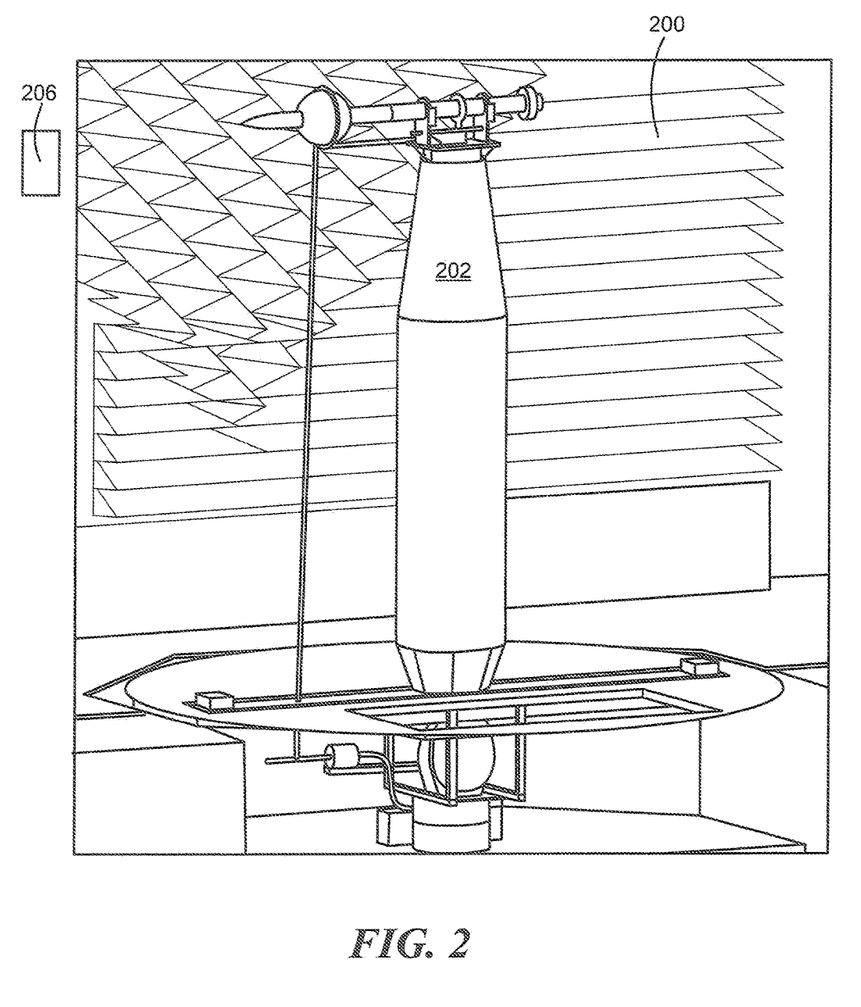
FIG. 2 is a schematic representation of a anechoic chamber for thermal testing of an antenna.

FIG. 2 shows an anechoic chamber 200 containing an antenna thermal testing system 202, which can be similar to the system 100 of FIG. 1. The thermal testing system 202 can manipulate the unit under test in a manner described in conjunction with FIG. 1 and below. The anechoic chamber 200 has interior surfaces covered with RF-absorbing materials 204 to provide a simulated real-world environment. A RF anechoic chamber absorbs internal RF reflections to the extent possible and shields from external RF signals. One or more RF sources 206 can transmit signals that can be received by the antenna on the unit under test. The performance of the antenna including temperature affects can be determined for the known signal received by the antenna under test. The antenna under test is used to receive signals transmitted by the source antenna in the RE chamber and evaluate temperature affects in a similar manner.

The size of the anechoic chamber can vary to meet the needs of a particular application. It will be appreciated that larger chambers require more RF absorber material than smaller chambers. RF chambers range in size based on operating frequency range. Embodiments of the invention can be adapted to operate in any RF indoor or outdoor facility.

Figure 2A:
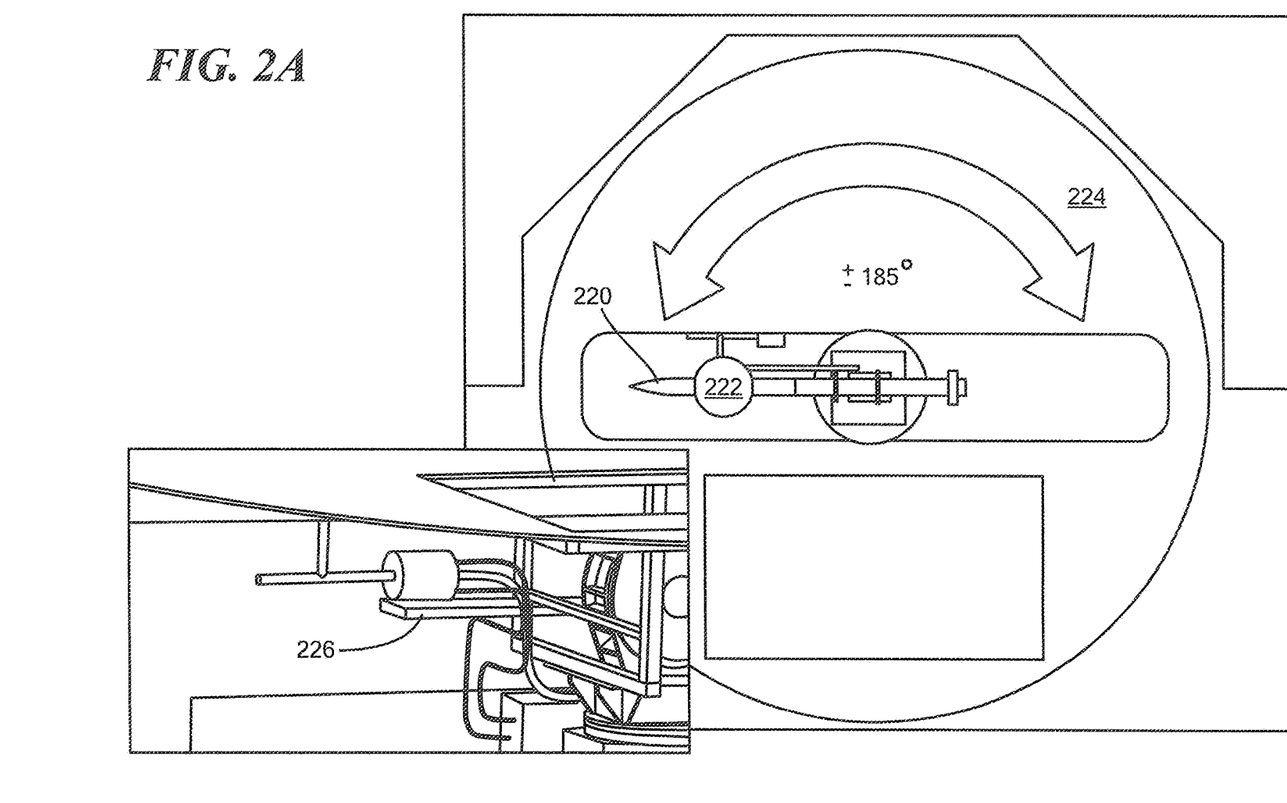
FIG. 2A shows a top view of a system for thermal testing of an antenna with a turntable to rotate a unit under test.
Figure 2B:
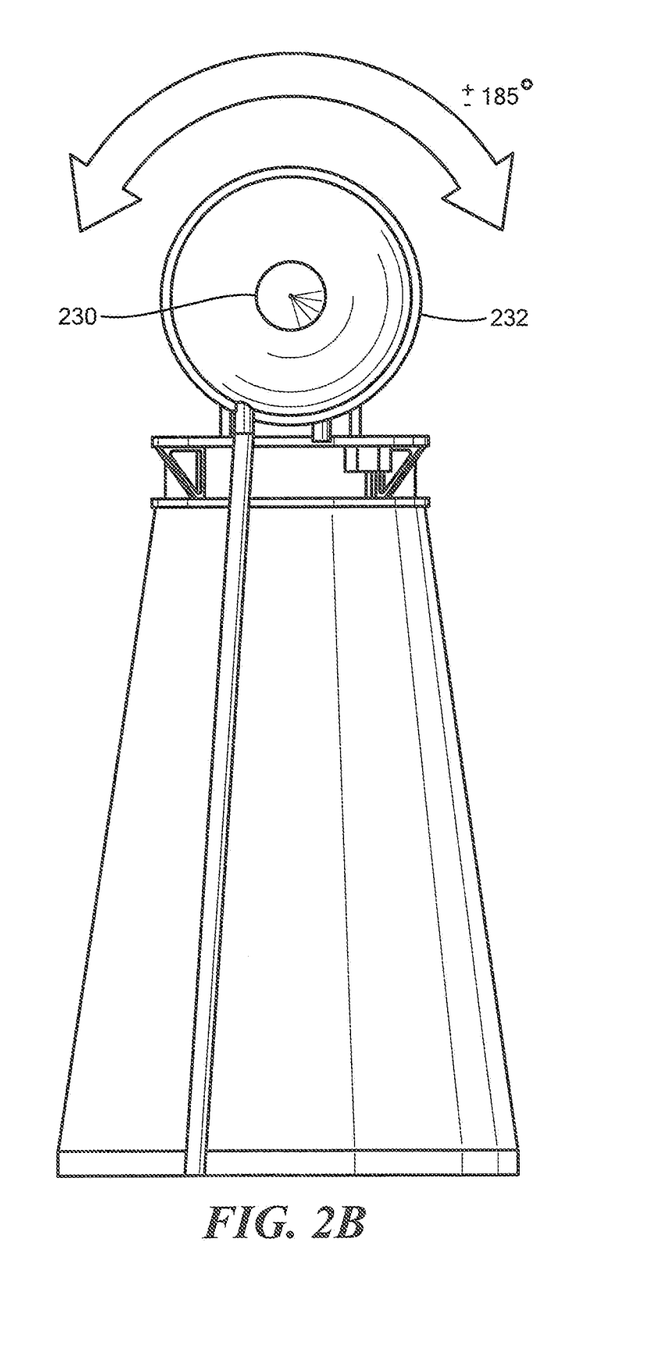
FIG. 2B shows a front of a system for thermal testing of an antenna with roll rotation of the unit under test.
Figure 2C:
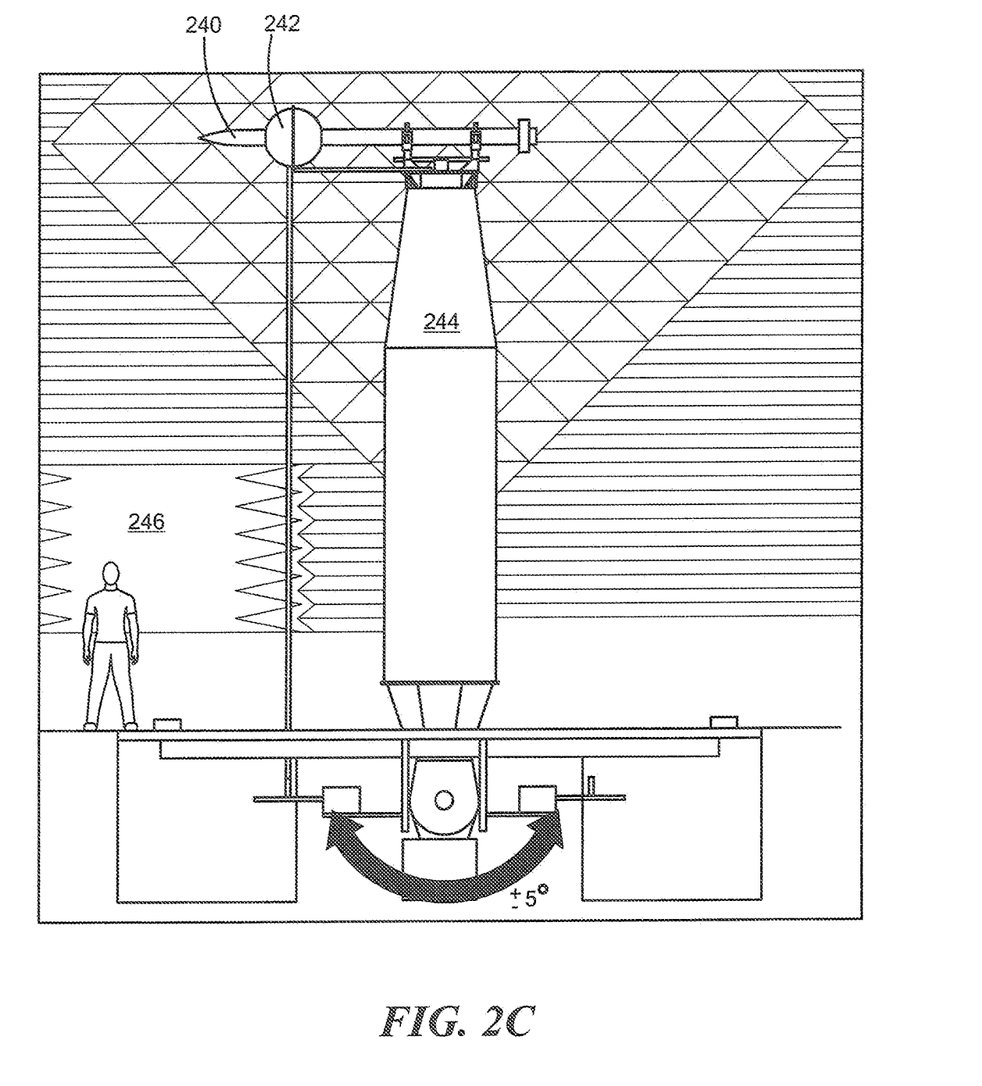
FIG. 2C is a schematic representation of a system for thermal testing of an antenna with elevation adjustment.
Figure 2D:
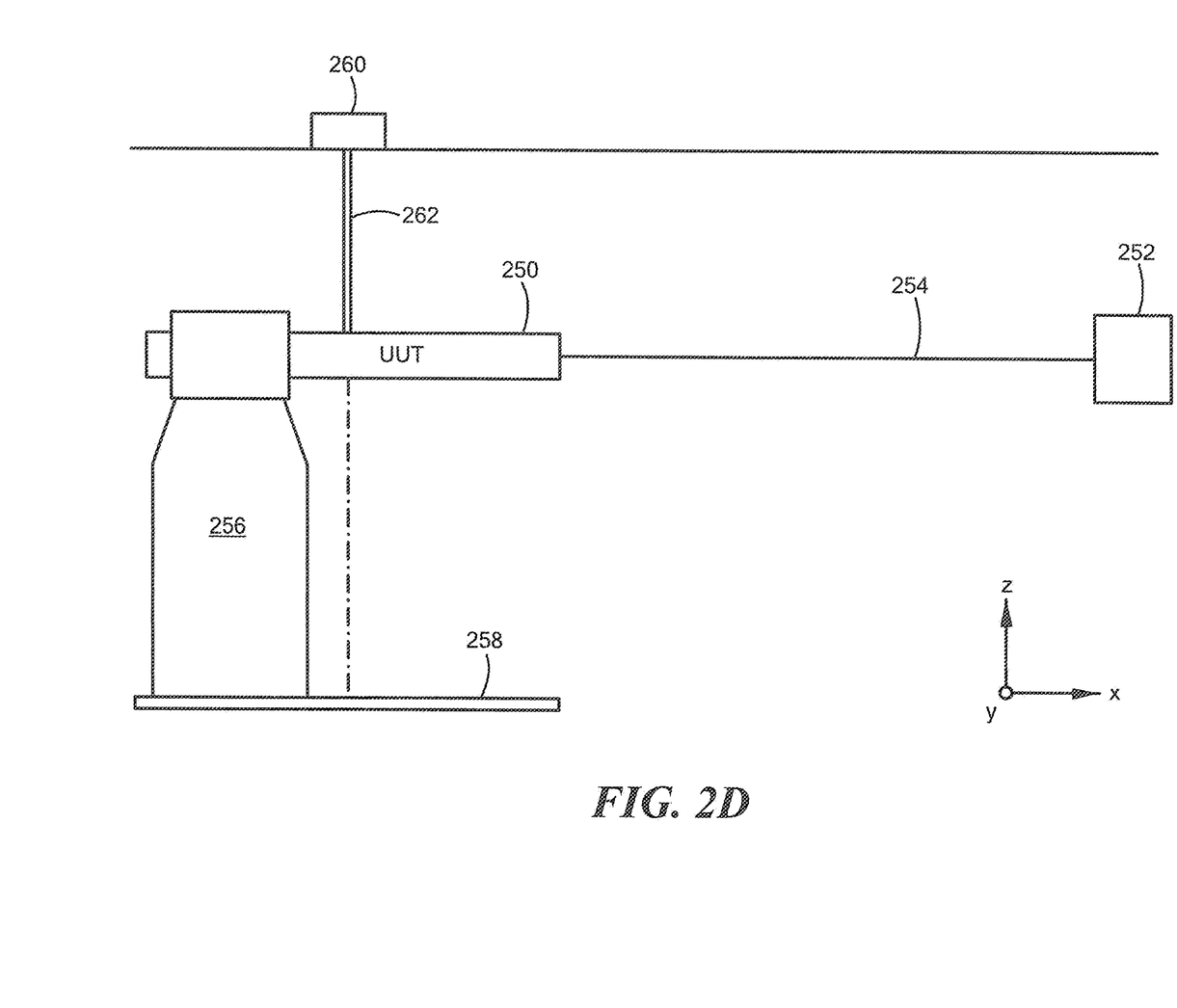
FIG. 2D is a schematic representations showing unit under test alignment for a system for thermal testing of an antenna

FIG. 2A shows a unit under test 220 and heat chamber 222 on a turntable 224 that can rotate in azimuth plus/minus 185 degrees. In an illustrative embodiment, a heat source 226 is mounted to the turntable 224. FIG. 2B shows roll (rotation about a longitudinal axis) of an elongate unit under test 230 with attached heat chamber 232, which can remain stationary. FIG. 2C shows a unit under test 240 with attached heat chamber 242 on a foam tower 244. The tower/unit under test can be moved in elevation, plus/minus five degrees, for example, to align the unit under test 240 with respect to the anechoic chamber 246, feed, etc. FIG. 2D shows an illustrative embodiment for alignment of a unit under test 250 with a remote feed 252 along an elevation/roll center line 254. The unit under test 250 is supported by a positioner 256, which is located on a turntable 258. A laser 260, for example, can be used to align the unit under test along an elevation azimuth center line 262. The unit under test 250 can be rotated in azimuth to ensure that EL/AZ of the turntable 258 is at the same elevation as the feed 252.

In general, the heat chamber can be formed from any suitable material that is resistant to heat up to about 700 degree Celsius, for example, substantially transparent to RF energy, and acceptably rigid/pliant to meet the needs of a particular application. Illustrative materials include Ceramic Matrix Composite (CMC) which comprises a polysiloxane resin in a weave fabric. The composite material can be selected based on a desired temperature range.

The tubing to provide heated air to the heat chamber should also be heat resistant and RE transparent. Suitable tubing materials include polyimide seamless tubing, which can be obtained from AMERICAN DURAFILM Inc. The tubing can be belled at one end to allow connection of tubing sections to make custom lengths as needed. In general, any suitable RE transparent tubing or material can be used.

Figure 3:
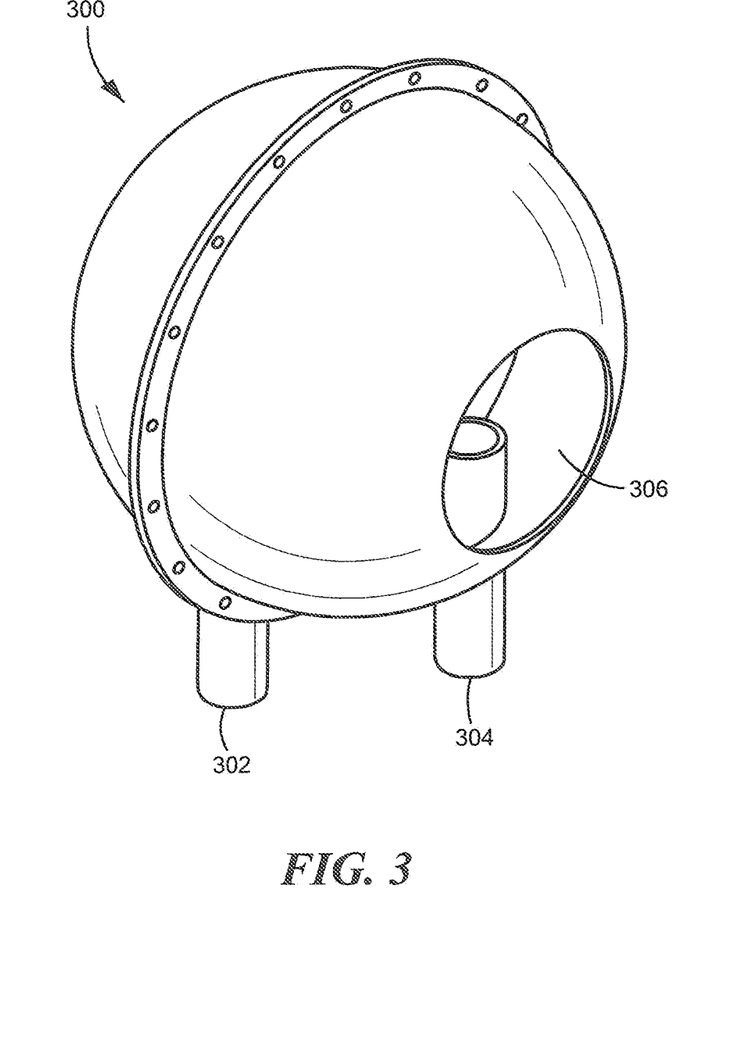
FIG. 3 shows a schematic representation of an illustrative heat chamber.

FIG. 3 shows a schematic representation of a heat chamber 300 having an inlet 302 and an outlet 304 that can be coupled to tubing to allow the ingress and egress of heated air. The heat chamber 300 can farther include at least one aperture 306 into which a unit under test can be inserted. In one embodiment, a further aperture aligned with aperture 306 allows a portion of the unit under test to exit the heat chamber 300 such that the heat chamber captures an antenna on a surface of the unit under test. In one particular embodiment, a spherical heat chamber has a diameter of about 18 inches.

In the illustrated embodiment, the heat chamber 300 is generally spherical. It is understood, however, that the heat chamber can have any geometry and/or configuration to provide heating of a surface antenna in a controlled environment. Illustrative geometries include football-shaped, hemispherical, elongate, ovular, square, rectangular, elliptical, polygonal, including any portion of such shapes to fit over an antenna or surface on or under which an antenna is located.

Figure 4:
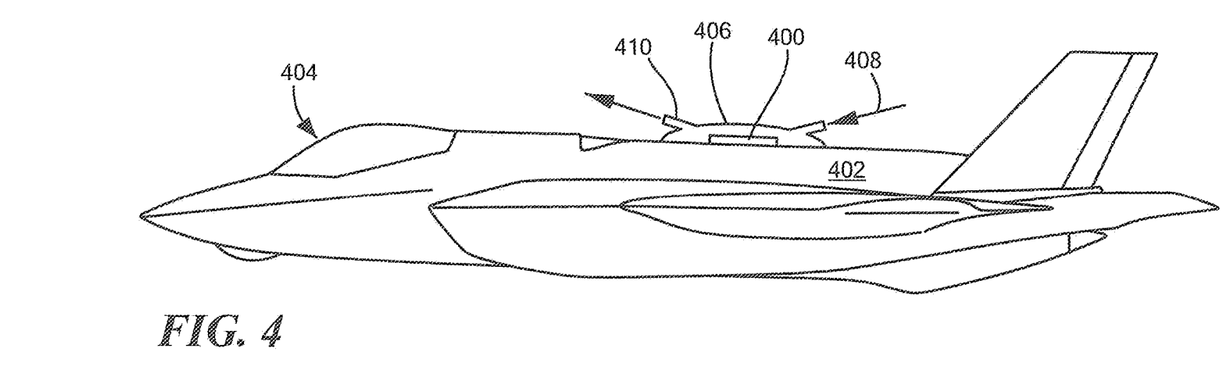
FIG. 4 is a schematic representation of an aircraft antenna covered by a RF transparent heat chamber.

FIG. 4 is a schematic representation of an antenna 400 on a surface 402 of an aircraft 404 covered by a RF transparent heat chamber 406 having a generally hemispherical configuration. The heat chamber 406 includes an inlet 408 and outlet 410 to allow heated air to fill the interior of the chamber and heat up the antenna 400 to a desired temperature. As the antenna 400 is heated to desired temperatures, antenna performance characteristics can be measure to evaluate the affects of temperature.

Figure 5:
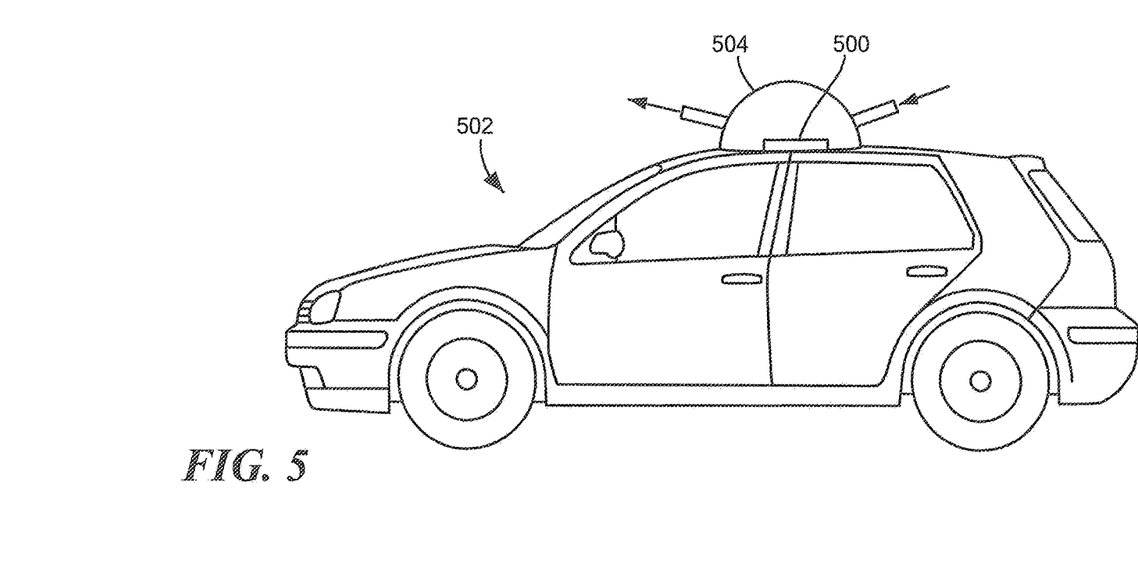
FIG. 5 is a schematic representation of a GPS antenna for a vehicle covered by a RF transparent heat chamber.

FIG. 5 is a schematic representation of a GPS antenna 500 on a vehicle 502 covered by a RF transparent heat chamber 504. It will be readily appreciated that a GPS antenna on a car can be heated by solar radiation to high temperatures that can impact performance of the GPS system. Thermal testing and evaluation of temperature effects on the antenna can enable the GPS system to compensate for extreme antenna temperatures.

Figure 5A:
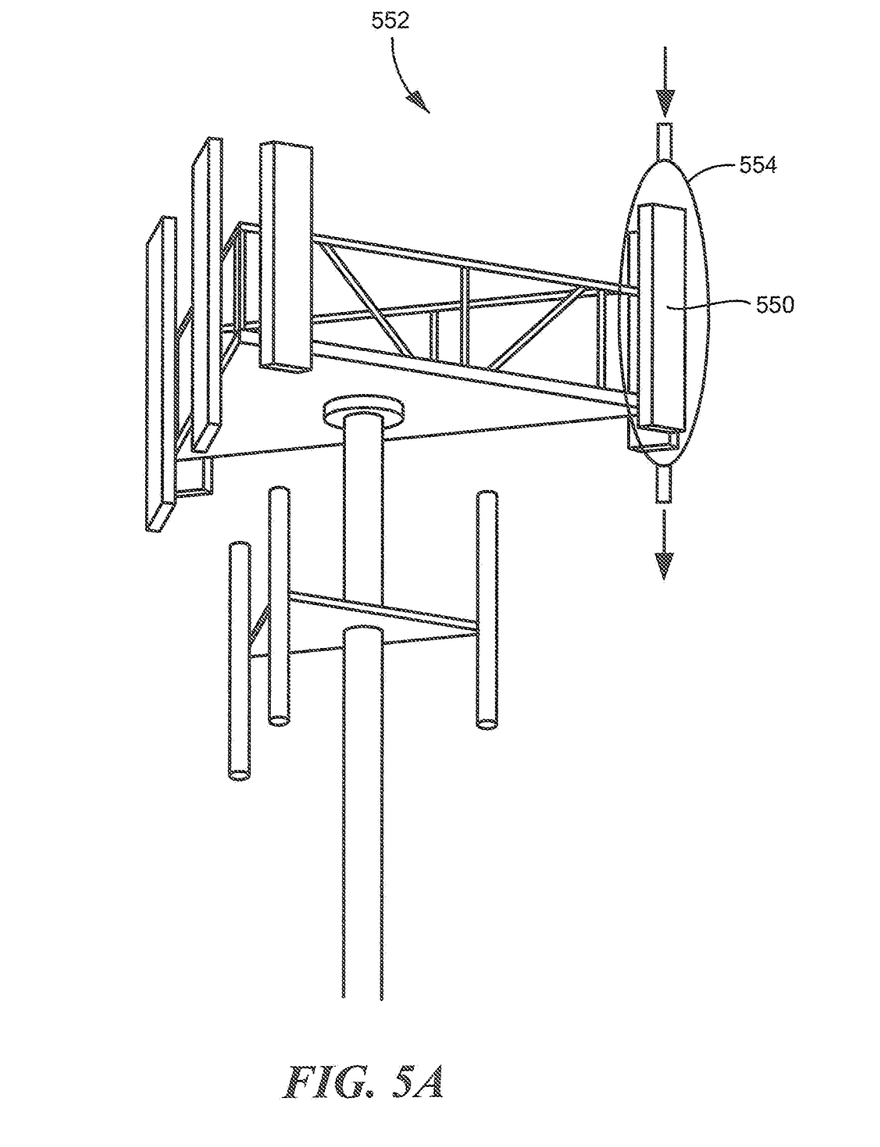
FIG. 5a is a schematic representation of a portion of a cell tower having antenna covered by a RF transparent heat chamber.

FIG. 5A is schematic representation of an antenna 550 on a cell tower 552. The antenna 550 is covered by a RF transparent heat chamber 554. It is understood that only a portion or a mock up of a tower, or any other unit under test, can be used for antenna thermal testing.

Figure 6:
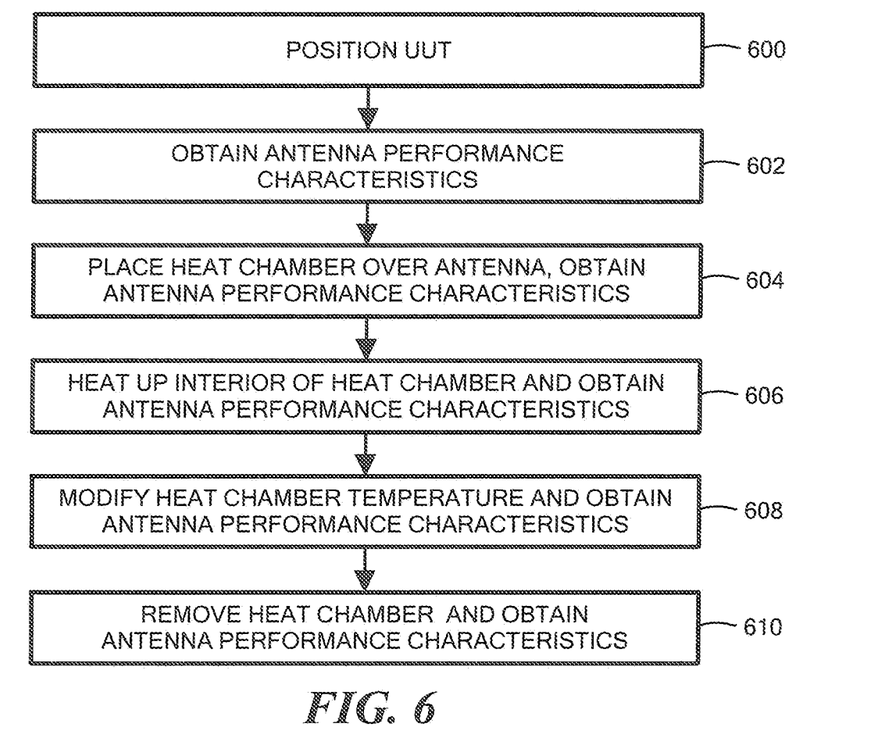
FIG. 6 is a flow diagram of an illustrative sequence of steps for thermal testing of an antenna.

FIG. 6 is a flow diagram of an illustrative sequence of steps for thermal testing of an antenna. In step 600, a unit under test having an antenna is positioned in an anechoic chamber having a thermal test system. In step 602, the antenna is exercised to obtain performance characteristics of the antenna. In step 604, a RF transparent heat chamber is placed over the antenna and the antenna is exercised to obtain performance characteristics of the antenna and identify any changes due to the presence of the heat chamber. In step 606, the interior of the heat chamber is heated to a desired temperature and after a given soak time for the antenna to reach temperature, the antenna is exercised to obtain performance characteristics of the antenna and identify any changes due to the temperature change of the antenna. In optional step 608, the heat chamber can be controlled to heat the antenna to any set of desired temperatures to obtain temperature-performance characteristics of the antenna. In optional step 610, the heat chamber is removed from the antenna, which is allowed to cool to ambient temperature. The antenna can be exercised to identify any permanent performance characteristics of the antenna due to the thermal processing, a RF transparent heat chamber is placed over an antenna.

Figure 7:
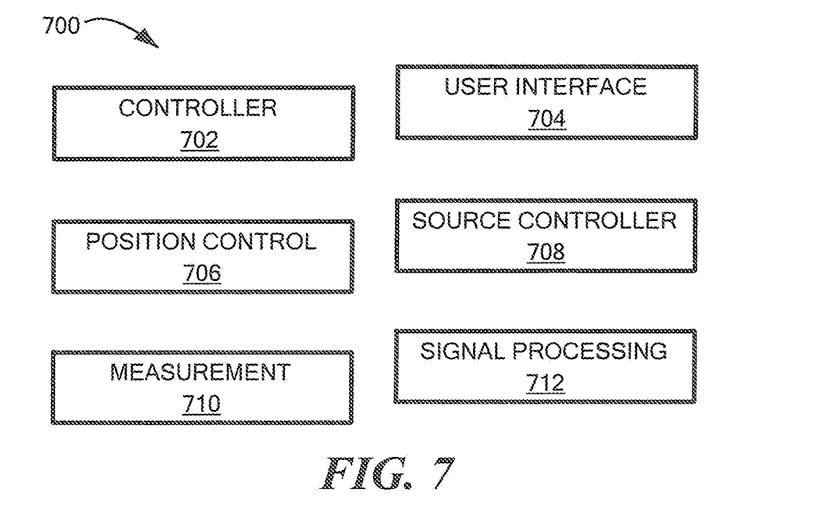
FIG. 7 is a schematic block diagram of a system for thermal testing of an antenna.

FIG. 7 shows an illustrative system 700 for antenna thermal testing. A control module 702 controls overall operation of the system. A user interface 704 coupled to the control module 702 enables a user to interface with the system. For example, a user can input information on the antenna under test and select a thermal test protocol having various temperatures and measurements. A position control module 706 manipulates a position of the unit under test, which can be moved in azimuth, elevation and yaw in relation to a RF source, for example, to evaluate performance of the antenna over temperature. A source control module 708 controls a RF source to transmit and/or receive signals from the antenna under test. The RE source can exercise the antenna over a range of frequencies, positions, and temperatures. Measurement module 710 controls and stores antenna measurements. A signal processor 712 processes the antenna measurement to analyze temperature effects on the antenna. A data collection module 714 collects the antenna pattern data from the signal processor 712. This data can be analyzed to determine the antenna patterns.

Figure 8:
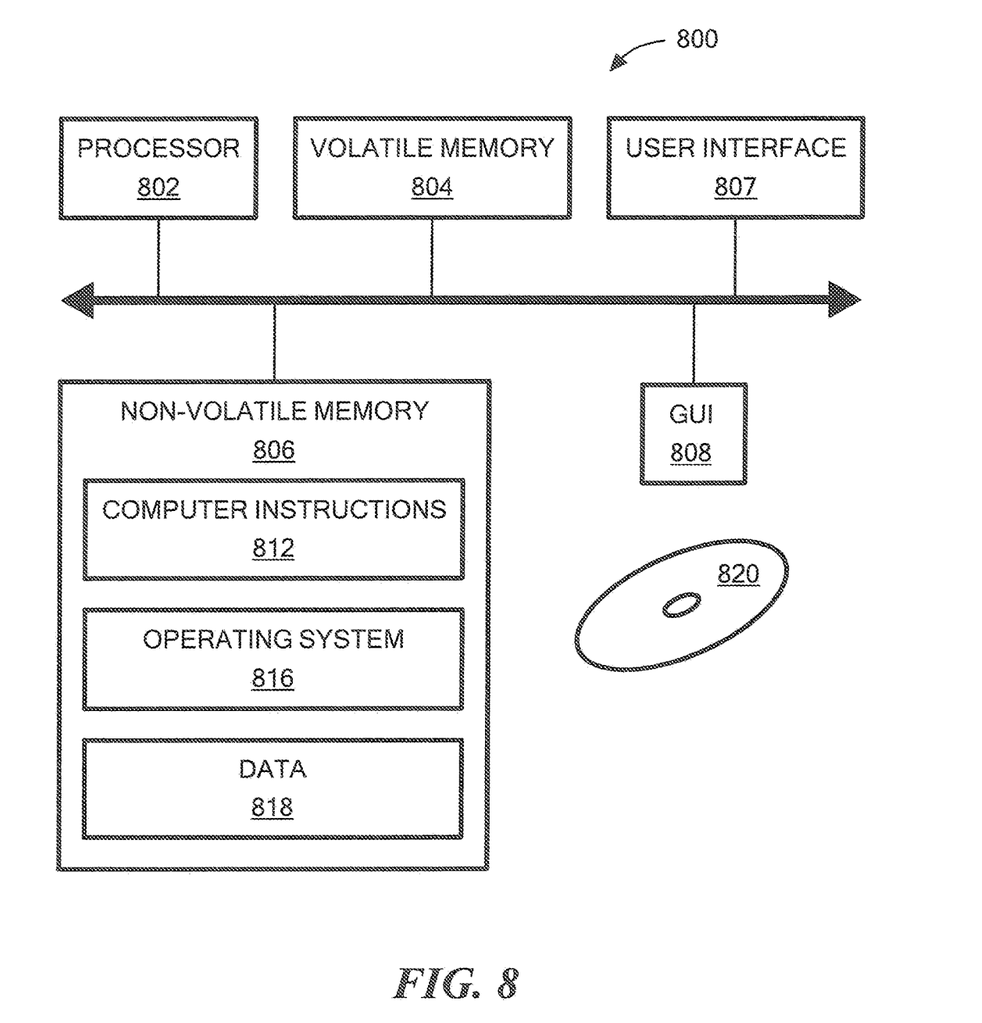
FIG. 8 is a schematic representation of an illustrative computer that can perform at least a portion of the processing described herein.

FIG. 8 shows an exemplary computer 800 that can perform at least part of the processing to described herein. The computer 800 includes a processor 802, a volatile memory 804, a non-volatile memory 806 (e.g., hard disk), an output device 807 and a graphical user interface (GUI) 808 (e.g., a mouse, a keyboard, a display, for example). The non-volatile memory 806 stores computer instructions 812, an operating system 816 and data 818. In one example, the computer instructions 812 are executed by the processor 802 out of volatile memory 804. In one embodiment, an article 820 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
  positioning a unit under test having an antenna in an anechoic chamber;
  manipulating a RF transparent heat chamber over the antenna, wherein the RF transparent heat chamber is contained in the anechoic chamber;
  raising a temperature in the heat chamber to a selected temperature by using RF transparent tubing to carry heated air to the heat chamber; and
  obtaining antenna performance information while the antenna is heated in the heat chamber.

2. The method according to claim 1, further including manipulating the heat chamber to a number of temperatures and obtaining antenna performance information for the number of temperatures.

3. The method according to claim 1, further including obtaining antenna performance information before installation of the heat chamber over the antenna.

4. The method according to claim 3, further including obtaining antenna performance information after installation of the heat chamber over the antenna and before heating of the heat chamber.

5. The method according to claim 1, further including obtaining antenna performance information after removal of the heat chamber over the antenna.

6. The method according to claim 5, further including obtaining antenna performance information after the antenna reaches ambient temperature.

7. The method according to claim 1 further including manipulating the position of the unit under test in azimuth, elevation and/or roll.

8. The method according to claim 1, wherein the heat chamber is substantially spherical with at least one aperture into which a portion of the unit under test is placed.

9. The method according to claim 1, wherein at least a portion of the heat chamber has a hemispherical shape.

10. The method according to claim 1, wherein the heat chamber comprises a CMC material.

11. The method according to claim 1, further including heating the heat chamber to a temperature of greater than 500 degrees Celsius.

12. The method according to claim 1, wherein unit under test comprises at least a portion of a missile.

13. The method according to claim 1, wherein unit under test comprises at least a portion of an aircraft.

14. The method according to claim 1, wherein unit under test comprises at least a portion of a vehicle having a GPS system.

15. The method according to claim 1, wherein the unit under test comprises at least a portion of a cell tower.

16. A vehicle having an antenna tested in accordance with claim 1.

17. A system, comprising:
  a positioning system to position a unit under test having an antenna in an anechoic chamber;
  a RF transparent heat chamber disposed over the antenna, wherein the RF transparent heat chamber is contained within the anechoic chamber;
  RF transparent tubing to carry heated air to the heat chamber;
  a control system to raise a temperature in the heat chamber to a selected temperature; and
  a measurement system to obtain antenna performance information while the antenna is heated in the heat chamber.

18. The system according to claim 17, wherein the positioning system manipulates the position of the unit under test in azimuth, elevation and/or roll.

19. A system, comprising:
  a positioning system to position a unit under test having an antenna in an anechoic chamber;
  a RF transparent heat chamber disposed over the antenna, wherein the RF transparent heat chamber is contained within the anechoic chamber;
  a control system to raise a temperature in the heat chamber to a selected temperature; and
  a measurement system to obtain antenna performance information while the antenna is heated in the heat chamber, wherein the positioning system manipulates both the heat chamber and the unit under test in azimuth, elevation and/or roll.

* * * * *